United States Patent [19]
Hagura

[11] Patent Number: 5,879,101
[45] Date of Patent: Mar. 9, 1999

[54] INNER SHIELD COUPLING CLAM WITH SAFETY

[75] Inventor: Satoshi Hagura, Shiga, Japan

[73] Assignee: NEC Corporation, Tokyo, Japan

[21] Appl. No.: 806,776

[22] Filed: Feb. 26, 1997

[30] Foreign Application Priority Data

Mar. 29, 1996 [JP] Japan ................................. 8-076026

[51] Int. Cl.⁶ .............................. F16B 5/06; H01J 29/02
[52] U.S. Cl. ......................... 403/326; 403/393; 24/295; 24/293
[58] Field of Search ................................ 403/326, 327, 403/393; 24/295, 293

[56] References Cited

U.S. PATENT DOCUMENTS

| | | | |
|---|---|---|---|
| 1,959,096 | 5/1934 | Fernberg | 24/295 |
| 2,086,288 | 7/1937 | Van Uum | 24/295 X |
| 2,520,725 | 8/1950 | Judd | 403/326 X |
| 2,631,345 | 3/1953 | Pouptich | 24/293 |
| 2,659,950 | 11/1953 | West | 24/293 |
| 3,864,789 | 2/1975 | Leitner | 24/293 |
| 5,539,962 | 7/1996 | Lee | 24/293 X |

FOREIGN PATENT DOCUMENTS

| | | | |
|---|---|---|---|
| 1402266 | 5/1965 | France | 24/295 |
| 62-13787 | 3/1987 | Japan . | |
| 4233134 | 8/1992 | Japan . | |

*Primary Examiner*—Anthony Knight
*Attorney, Agent, or Firm*—Sughrue, Mion, Zinn, Macpeak & Seas, PLLC

[57] ABSTRACT

In a method of manufacturing a clamp, an elastic band member is bent into a direction of an inner surface at a center position of the band member. The band member having the inner surface and an outer surface. The band member is bent into the direction of the inner surface at first bending portions having a first predetermined length from the center bending portion to form first extending portions. The band member is bent into a direction of the outer surface at second bending portions having a second predetermined length from the first bending portions in tip directions to form second extending portions. The band member is bent into the direction of the outer surface at third bending portions having a third predetermined length from the second bending portions in the tip directions to form third extending portions. The band member is bent into the direction of the inner surface at fourth bending portions having a fourth predetermined length from the third bending portions in the tip directions to form fourth and fifth extending portions.

12 Claims, 4 Drawing Sheets

INNER SHIELD COUPLING CLAM WITH SAFETY

BACKGROUND OF THE INVENTION

1. Field of the Invention

The present invention relates to a coupling clamp, and more particularly to an inner shield coupling clamp which does not damage and peel a blackened layer formed on an inner shield.

2. Description of Related Art

Generally, in a cathode-ray tube of a television and a display, especially, in the cathode-ray tube of a shadow mask type, a frame is arranged inside a face panel to support a shadow mask. In addition to the shadow mask, an inner shield is installed in this frame to reduce influence of earth magnetism. A blackened layer is formed on the inner shield. The frame and the inner shield are coupled by an inner shield coupling clamp. When the frame and the inner shield are attached, the inner shield coupling clamp is required to be easily inserted in a common hole passing through the frame and the inner shield. Also, the inner shield coupling clamp is required to have the strong strength to hold them in a tightly coupled state.

FIG. 1 is a general perspective view to explain a coupling state of the frame and the inner shield. As shown in FIG. 1, the inner shield S is put on the frame F and the inner shield coupling clamp 11 which has the above-mentioned elastic structure is inserted in common through-holes H. Thereby, the frame F and the inner shield S are coupled as a unitary body.

FIG. 2 is a perspective view of the first conventional example of inner shield coupling clamp. As sown in FIG. 2, a band-shape elastic metal body is bent in a V-like shape at the center portion in the longitudinal direction of the elastic metal body to form a center bending portion 12. The first bending portions 13, the second bending portions 14, the third bending portions 16 are sequentially formed in a line symmetrical manner with respect to the center bending portion 12 as a convex portion. As a result, the inner shield coupling clamp 11 is formed to have an elastic structure. The fourth extending portions 17 from the third bending portions 16 to tip portions of the elastic metal band is a picking-up section and a holding section is composed of the second extending portions between the first bending portions and the second bending portions and the tip portions of the fourth extending portions to hold the frame and the inner shield in the coupled state. The inner shield coupling clamp holds the frame F and the inner shield S by the holding section 15 of the inner shield coupling clamp 11.

There is a case where the tip portion 17a of the fourth extending portion 17 has a metallic broken-out section and the blackened layer formed on the inner shield S is sometime damaged and peeled. In this case, mask holes of the shadow mask is filled with the blackened layer peeled off from the inner shield and the breakdown voltage characteristic of the electron gun structure is degraded. As a result, the peeled blackened layer sometimes has a bad influence to the characteristics of the cathode-ray tube.

The work to insert the inner shield coupling clamp 11 into the through-hole is hand-worked. However, because the picking-up portion 17 of the first conventional example of the inner shield coupling clamp 11 is small, the inner shield coupling clamp 11 cannot be easily picked up by a hand. Also, the workability is not good to drop the inner shield coupling clamp 11 on the way of coupling the frame and the inner shield.

FIG. 3 is a cross sectional view illustrating the clamping state in which the frame and the inner shield are clamped by the second conventional example of the inner shield coupling clamp. The inner shield coupling clamp shown in FIG. 3 is disclosed in Japanese Laid Open Patent Disclosure (JP-A-Heisei 4-233134). In the inner shield coupling clamp, the tip portions of the holding section is bent in an outside direction to have an obtuse angle equal to or more than 90 degrees. The inner shield is pushed to the frame by the tip portions. In the structure, the tip portions have a metallic broken-out section like the above-mentioned example, the blackened layer of the inner shield 31 is damaged and sometimes peeled.

On the other hand, FIG. 4 is a cross sectional view illustrating the clamping state in which the frame and the inner shield are clamped by the third conventional example of the inner shield coupling clamp. The inner shield coupling clamp shown in FIG. 4 is disclosed in Japanese Examined Patent Disclosure (JP-B2-Showa 62-13787). In the inner shield coupling clamp, the inner shield 41 is pushed to the frame by the shoulder portions 40a. Because the inner shield 41 is pushed by the shoulder portions 40a, a blackened layer on the inner shield 41 is rarely injured and peeled. However, the third conventional example of the inner shield coupling clamp has the structure In which it is difficult to pick up the coupling clamp. Therefore, the structure should be improved on the workability.

SUMMARY OF THE INVENTION

Therefore, a present invention is made in view of this above-mentioned problems. An object of the present invention is to provide an inner shield coupling clamp in which workability is improved and a blackened layer formed on an inner shield is not injured in a coupling state of a frame and the inner shield.

In order to achieve an aspect of the present invention, an inner shield coupling inner shield coupling clamp includes a center bending portion formed by bending an elastic band member into a direction of an inner surface at a center position of the band member, the band member having the inner surface and an outer surface, first bending portions formed by further bending the band member into the direction of the inner surface at positions having a first predetermined length from the center bending portion to form first extending portions, second bending portions formed by bending the band member into a direction of the outer surface at positions having a second predetermined length from the first bending portions in tip directions to form second extending portions, third bending portions formed by further bending the band member into the direction of the outer surface at positions having a third predetermined length from the second bending portions in the tip directions to form third extending portions, and fourth bending portions formed by bending the band member into the direction of the inner surface at positions having a fourth predetermined length from the third bending portions in the tip directions to form fourth and fifth extending portions.

In this case, it is desirable that an angle between the first portions at the center position is in a range of 45 to 90 degrees, an angle between the first extending portion and the second extending portion is in a range of 90 to 135 degrees, an angle between the second extending portion and the third extending portion is in a range of 90 to 135 degrees, an angle between the third extending portion and the fourth extending portion is in a range of 30 to 60 degrees, and an angle between the fourth extending portion and the fifth extending portion is in a range of 30 to 60 degrees.

In addition, it is desirable that a tip of each of the fifth extending portions is bent in the direction of the inner surface in a curved manner.

In this manner, the fourth extending portions function as a picking-up section and the second extending portions and the fourth bending portions function as a holding section, when the inner shield coupling inner shield coupling clamp is inserted a common hole of a frame and an inner shield.

In order to achieve another aspect of the present invention, a method of manufacturing an inner shield coupling clamp comprising the steps of:

bending an elastic band member into a direction of an inner surface at a center position of the band member, the band member having the inner surface and an outer surface;

bending the band member into the direction of the inner surface at first bending portions having a first predetermined length from the center bending portion to form first extending portions;

bending the band member into a direction of the outer surface at second bending portions having a second predetermined length from the first bending portions in tip directions to form second extending portions;

bending the band member into the direction of the outer surface at third bending portions having a third predetermined length from the second bending portions in the tip directions to form third extending portions; and bending the band member into the direction of the inner surface at fourth bending portions having a fourth predetermined length from the third bending portions in the tip directions to form fourth and fifth extending portions.

DESCRIPTION OF THE PREFERRED EMBODIMENTS

The inner shield coupling clamp of the present invention will be described below in detail with reference to the accompanying drawings.

Figure 1:
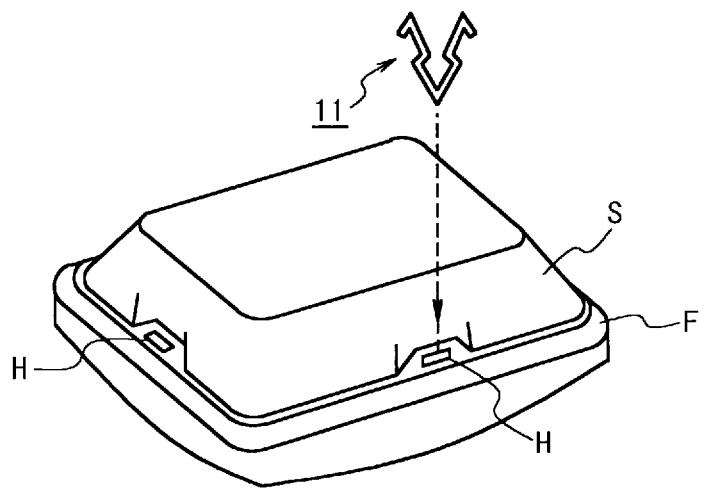
FIG. 1 is a general perspective view illustrating a state in which a frame and an inner shield are clamped by an inner shield coupling clamp.
Figure 2:
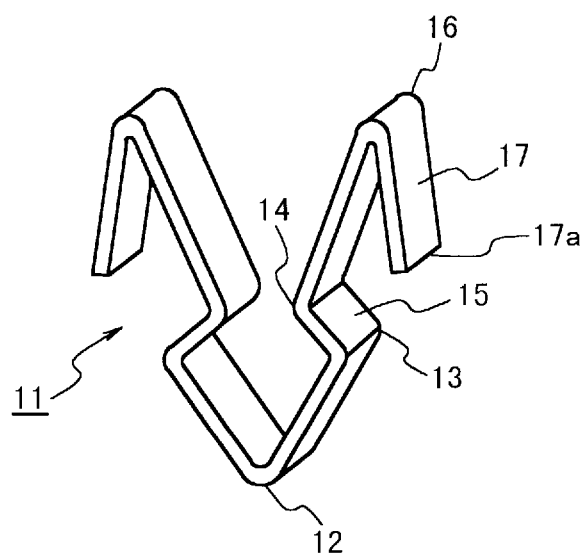
FIG. 2 is a perspective view illustrating the structure of the first conventional example of the inner shield coupling clamp.
Figure 3:
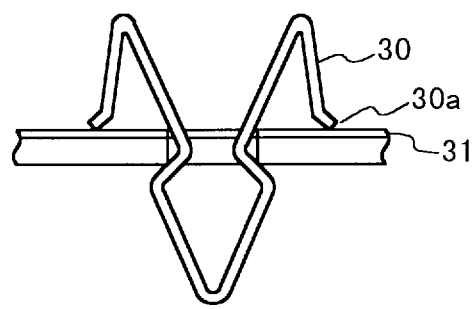
FIG. 3 is a cross sectional view illustrating the structure of the second conventional example of the inner shield coupling clamp which couples the inner shield to the frame.
Figure 4:
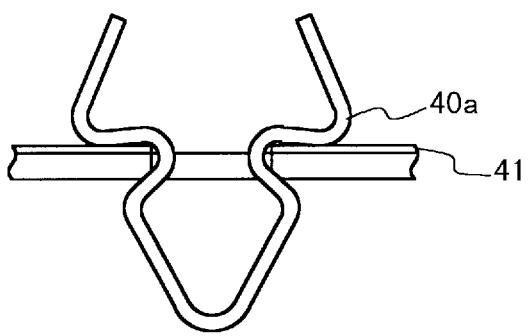
FIG. 4 is a cross sectional view illustrating the structure of the third conventional example of the inner shield coupling clamp which couples the inner shield to the frame.
Figure 5:
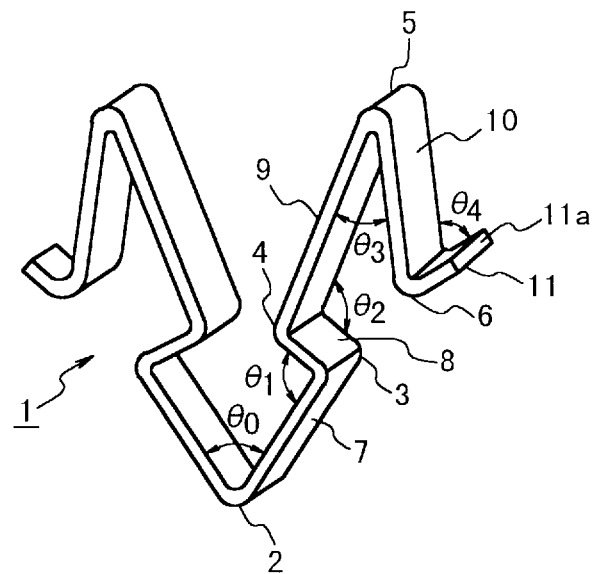
FIG. 5 is a perspective view illustrating the structure of the inner shield coupling clamp according to the first embodiment of the present invention.

FIG. 5 is a perspective view illustrating the structure of the inner shield coupling clamp according to the first embodiment of the present invention. Referring to FIG. 5, the inner shield coupling claim 1 is composed of an elastic metal band and has a center bending portion 2, the first bending portions 3, the second bending portions 4, the third bending portions 5, and the fourth bending portions 6. The first to fourth bending portions 3 to 6 are provided in a line symmetry with respect of the center bending portion 2. There are provided the first extending portions 7 between the center bending portion 2 and the first bending portions 3, the second extending portions 8 between the first bending portion 3 and the second bending portions 4, the third extending portions 9 between the second bending portion 4 and the third bending portions 5, the fourth extending portions 10 between the third bending portion 5 and the fourth bending portions 6, and the fifth extending portions 11 from the fifth bending portions 6 to the tip portions 11a.

Next, a method of manufacturing the inner shield coupling clam 1 will be described. The elastic metal band has an inner surface and an outer surface and is bent at the center portion 2 in a direction of the inner surface in a V-like shape to have an angle $\theta 0$ in range of 45 to 90 degrees. At a portion of the first predetermined length from the center bending portion 2 as the first bending portion 3, the elastic metal band is bent in a direction of the inner surface to have an angle $\theta 1$ in range of 90 to 135 degrees. Thus, the first extending portions 7 are formed. Subsequently, at a portion of the second predetermined length from the first bending portion 3 as the second bending portion 4, the elastic metal band is bent in a direction of the outer surface to have an angle $\theta 2$ in range of 90 to 135 degrees. Thus, the second extending portions 8 are formed. Subsequently, at a portion of the third predetermined length from the second bending portion 4 as the second bending portion 5, the elastic metal band is bent in a direction of the outer surface to have an angle $\theta 3$ in range of 30 to 60 degrees. Thus, the third extending portions 9 are formed. Finally, at a portion of the fourth predetermined length from the third bending portion 5 as the fourth bending portion 6, the elastic metal band is bent in a direction of the inner surface to have an angle $\theta 4$ in range of 30 to 60 degrees. Thus, the fourth and fifth extending portions 10 and 11 are formed. It is desirable that the angle at each of the bending portions is suitably selected in the above-mentioned range based on the shaped of the frame F and the inner shield S.

In the inner shield coupling clamp in the first embodiment manufactured in this manner, the fourth extending portions 10 form a picking-up section. Therefore, it is necessary that the length of the fourth extending portions 10 is longer than the length of the fifth extending portions 11. As a result, a user can easily pick up the inner shield coupling clamp 1.

Figure 6:
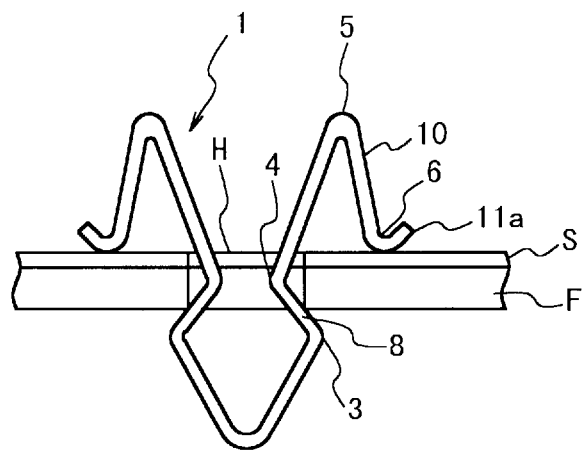
FIG. 6 is a cross sectional view illustrating the structure of the inner shield coupling clamp of the first embodiment which couples the inner shield to the frame.

FIG. 6 is a cross sectional view illustrating the structure of the inner shield coupling clamp of the first embodiment which couples the inner shield to the frame. Referring to FIG. 6, the inner shield S are arranged to be located on the frame F in such a manner that the hole H of the frame F and the hole H of the inner shield S are common. The inner shield coupling clamp of the present embodiment is inserted into the common hole H. As shown in FIG. 6, the lower surface of the frame F is supported by the second extending portions 8 and the inner shield S is pushed to the frame F by the fourth bending portions 6. In this manner, the second extending portions 8 and the fourth bending portions 6 form a holding section.

As mentioned above, in the present embodiment, the metal band is bent at the fourth bending portions 6 with a curvature to leave from the inner shield S. That is, in the inner shield coupling clamp 1 of the present invention, the inner shield S is pushed to and the frame F such that they are held as a unitary body. In this case, because the fourth bending portion 6 has the curvature, the metal broken-out section never directly contacts the inner shield S. Therefore, the blackened layer which is formed on the inner shield S is never injured and never peeled off.

Figure 7:
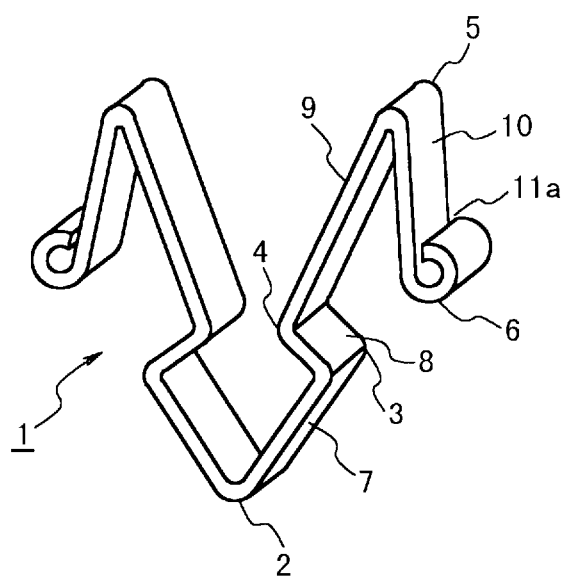
FIG. 7 is a perspective view illustrating the structure of the inner shield coupling clamp according to the second embodiment of the present invention.

FIG. 7 is a perspective view illustrating the structure of the inner shield coupling clamp of the second embodiment of the present invention. The inner shield coupling clamp in the second embodiment has substantially the same structure as that of the first embodiment. As shown in FIG. 7, the different point is in that the tip portion 11a of the fifth extending portion 11 is bent into a direction of the inner surface with a large curvature. As a result, when the picking-up section is picked up in order to insert the inner shield coupling clamp into the common hole H, the picking-up can be performed without hurting a fingertip.

As described above, according to the inner shield coupling inner shield coupling clamp of the present invention, the band-shape elastic metal body is bent like a character of "V" in the center portion to form the center bending portion at the vertex. Each of the bent elastic metal body portions is bent at four portions with predetermined distances from the center bending portion in the direction of inner surface or outer surface to form the first to fourth bending portions. The frame and the inner shield are contacted and tightly coupled by the holding section. In this manner, the fourth bending portion has a round portion and, therefore, the metal broken-out section of the inner shield coupling clamp has the structure in which it does not injure and peel the blackened film formed on the inner shield. Also, the inner shield coupling clamp has the picking-up section which is formed by suitably selecting the lengths of the fourth and fifth extending portions, the inner shield coupling clamp can be easily picked up so that the workability of insertion of the inner shield coupling clamp can be improved.

What is claimed is:

1. An inner shield coupling clamp comprising:
   a center bending portion formed by bending an elastic band member into a direction of an inner surface of said band member at a center position of said band member, said band member having said inner surface and an outer surface;
   first bending portions formed by further bending said band member into said direction of said inner surface at positions having a first predetermined length from said center bending portion to form first extending portions;
   second bending portions formed by bending said band member into a direction of said outer surface at positions having a second predetermined length from said first bending portions in tip directions to form second extending portions;
   third bending portions formed by further bending said band member into said direction of said outer surface at positions having a third predetermined length from said second bending portions in said tip directions to form third extending portions; and
   fourth bending portions formed by bending said band member into said direction of said inner surface at positions having a fourth predetermined length from said third bending portions in said tip directions to form fourth and fifth extending portions.

2. An inner shield coupling clamp according to claim 1, wherein an angle between said first portions at said center position is in a range of 45 to 90 degrees.

3. An inner shield coupling clamp according to claim 1, wherein an angle between said first extending portion and said second extending portion is in a range of 90 to 135 degrees.

4. An inner shield coupling clamp according to claim 1, wherein an angle between said second extending portion and said third extending portion is in a range of 90 to 135 degrees.

5. An inner shield coupling clamp according to claim 1, wherein an angle between said third extending portion and said fourth extending portion is in a range of 30 to 60 degrees.

6. An inner shield coupling clamp according to claim 1, wherein an angle between said fourth extending portion and said fifth extending portion is in a range of 30 to 60 degrees.

7. An inner shield coupling clamp according to claim 1, wherein a tip of each of said fifth extending portions is bent in said direction of said inner surface in a curved manner.

8. An inner shield coupling clamp according to claim 1, wherein said fourth extending portions function as a picking-up section for manually grasping said clamp.

9. An inner shield coupling clamp according to claim 1, wherein when said inner shield coupling clamp is inserted into a common hole of a frame and an inner shield, said second extending portions and said fourth bending portions function as a holding section for holding the frame to the inner shield.

10. The inner shield coupling clamp according to claim 1, wherein said third extending portions and said corresponding fourth extending portions form respective V-shaped portions which are inverted with respect to a V-shaped portion formed by said first extending portions.

11. The inner shield coupling clamp according to claim 10, wherein said fourth extending portions form respective picking-up sections so that said clamp can be manually inserted and removed by grasping said picking-up sections.

12. An inner shield coupling clamp according to claim 1, wherein a frame and an inner shield are clamped together by said second extending portions and said fourth bending portions.

* * * * *